United States Patent [19]

Schröder

[11] 3,976,946

[45] Aug. 24, 1976

[54] CIRCUIT ARRANGEMENT FOR FREQUENCY DIVISION BY NON-INTEGRAL DIVISORS

[75] Inventor: Gert Schröder, Hamburg, Germany

[73] Assignee: U.S. Philips Corporation, New York, N.Y.

[22] Filed: Dec. 20, 1974

[21] Appl. No.: 534,764

[30] Foreign Application Priority Data

Jan. 5, 1974 Germany............................. 2400394

[52] U.S. Cl..................................... 328/39; 328/48
[51] Int. Cl.² ................. H03K 21/00; H03K 21/32; H03K 23/06
[58] Field of Search .................... 307/220 R, 225 R; 328/39, 48

[56] References Cited
UNITED STATES PATENTS

| | | | |
|---|---|---|---|
| 3,353,104 | 11/1967 | Loposer................................. | 328/39 |
| 3,446,947 | 5/1969 | Overstreet, Jr. ....................... | 328/39 |
| 3,605,025 | 9/1971 | Lincoln et al.......................... | 328/48 |
| 3,614,631 | 10/1971 | Bevier et al............................ | 328/48 |
| 3,716,794 | 2/1973 | Teggatz et al. ....................... | 328/39 |
| 3,811,092 | 5/1974 | Charbonnier......................... | 328/39 |
| 3,896,387 | 7/1975 | Kokado................................. | 328/39 |

*Primary Examiner*—Stanley D. Miller, Jr.
*Attorney, Agent, or Firm*—Frank R. Trifari; Simon L. Cohen

[57] ABSTRACT

A circuit arrangement for generating an output frequency by division of an input frequency by adjustable divisors. Use is made of a first adjustable frequency divider having an output wherefrom the output frequency is derived, and a further frequency divider which is connected as an adjustable selection circuit and the counting input of which receives the output frequency. The input frequency is applied to the counting input of the first frequency divider via a gate. The output of the selection circuit is connected to one input of the gate such that each output signal of the selection circuit suppresses a given number of pulses of the input frequency.

2 Claims, 5 Drawing Figures

CIRCUIT ARRANGEMENT FOR FREQUENCY DIVISION BY NON-INTEGRAL DIVISORS

The invention relates to a circuit arrangement for generating an output frequency by division of an input frequency by adjustable divisors, utilizing a first adjustable frequency divider having an output from which the output frequency is derived, and a further frequency divider, connected as an adjustable selection circuit, the counting input of which receives the output frequency of the first adjustable frequency divider.

A circuit arrangement of this kind is known from U.S. Pat. No. 3,614,631. The known device is used for dividing the frequency of a continuously present input signal by integral or non-integral numbers, as desired, and comprises for this purpose a single loop incorporating a divider and a correction circuit.

The invention provides an extension of the present state of the art. The invention has for its object to replicate an unknown input frequency by division of a reference frequency. According to the invention, this is achieved without measurement of the unknown frequency. According to the invention, the unknown frequency is continuously duplicated, even if the said unknown frequency was only briefly present. This is achieved by the circuit arrangement according to the invention which is characterized in that the input frequency is applied to the counting input of the first frequency divider via a gate, the output of the selection circuit being connected to one input of the gate such that each output signal of the selection circuit suppresses a predetermined number of pulses of the input frequency, at least one of the following quantities:
 a. the divisor of the divider
 b. the selection values of the selection circuit being adjustable by external electrical signals, the electrical signals for the divisor of the divider and the selection values of the selection circuit being generated by two cascade-connected counters, the capacity of at least the counter situated at the beginning of the cascade and generating the selection values corresponding to the capacity of the selection circuit, the said counter receiving the input frequency via a gate during a period of time during which a number of pulses, corresponding to the capacity of this counter, of an available frequency to be replicated arrive.

Some embodiments of the circuit arrangement according to the invention will be described in detail hereinafter with reference to the drawing.

Figure 1:
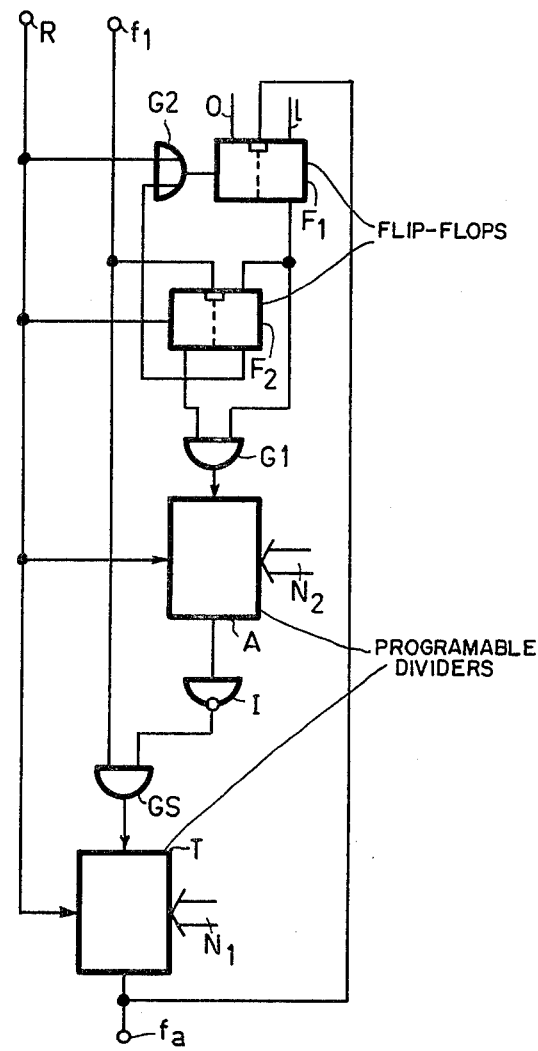
FIG. 1 shows a simple example of frequency division involving synchronization of the input signal of the selection circuit.

The counting input of the first frequency divider T, constructed as a normal divider, is preceded by a gate GS in FIG. 1. One input of this gate receives the input frequency $f_1$, and its other input is connected, via an inverter I, to the selection circuit A. The selection circuit A essentially also consists of a counter followed by a decoding circuit, so that at given, selected counter positions an output signal is generated. When such an output signal appears, the inverter I blocks the gate GS, with the result that no further input pulses can reach the frequency divider T.

The output of the frequency divider T, supplying the output frequency $f_a$, is connected to the counting input of the selection circuit A via a synchronization circuit consisting of the flipflops $F_1$ and $F_2$ and the gate $G_1$. This synchronization circuit is required because many commercially available counters used as frequency dividers supply only a short output signal, while the signal for blocking the gate GS must be present for at least one pulse period of the input frequency $f_1$. The operation of the synchronization circuit is as follows:

As soon as a signal appears on the output of the frequency divider T, which may be substantially shifted with respect to the triggering edge of the input frequency $f_1$ because of the summing of the various delay times incurred in the divider, the flipflop $F_1$ is set, while the flipflop $F_2$ remains in the reset state, with the result that the gate $G_1$ generates a pulse. If the counter of the selection circuit A in reaction to the pulse from $G_1$ assumes a position in which an output signal is generated, the gate GS will be blocked when the next pulse of the input frequency $f_1$ arrives. This pulse, however, also sets the flipflop $F_2$, so that the output signal of the gate $G_1$ disappears, and the next pulse of the input frequency $f_1$ from gate GS is thus allowed passage again to the frequency divider T.

Figure 2:
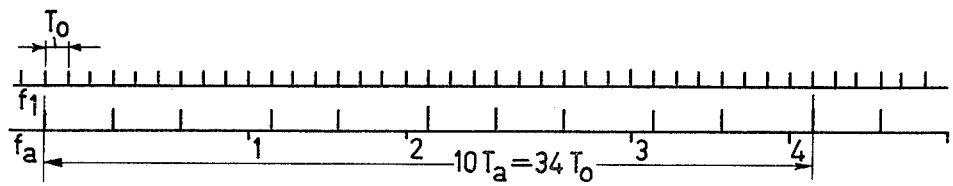
FIG. 2 shows a pulse diagram to illustrate the operation of the circuit arrangement shown in FIG. 1.

The operation of this circuit will be described in detail with reference to FIG. 2. For example, use is to be made of a divisor equal to 3.4., i.e. the input frequency should be divided by the number 3.4. The frequency divider T is then adjusted to the divisor $N_1$ 32 3, i.e. at every third input pulse of the input frequency $f_1$ the frequency divider supplies one output pulse $f_a$ as shown in FIG. 2 for the first three pulses. The selection circuit A is adjusted such that in one cycle of $$N_0 = 10 \text{ pulses}$$

on its counting input, each time corresponding to one pulse $f_a$, it generates $$N_2 = 4 \text{ output pulses,}$$

that is to say each time after the third, the fifth etc. pulse. Each time one pulse of the input frequency $f_1$ is then suppressed, these pulses being denoted by 1, 2 etc. in FIG. 2. Ten periods of the output frequency $f_a$ thus equal 34 periods of the input frequency $f_1$, as is clearly shown in FIG. 2, so that the mean period of the output frequency covers 3.4 periods of the input frequency as required.

The line R of FIG. 1 is a reset line by means of which all storage stages such as the multivibrators $F_1$ and $F_2$ and the counting stages of the selection circuit A and the frequency divider T can be reset to a defined starting position, i.e. the 0-position.

Figure 3:
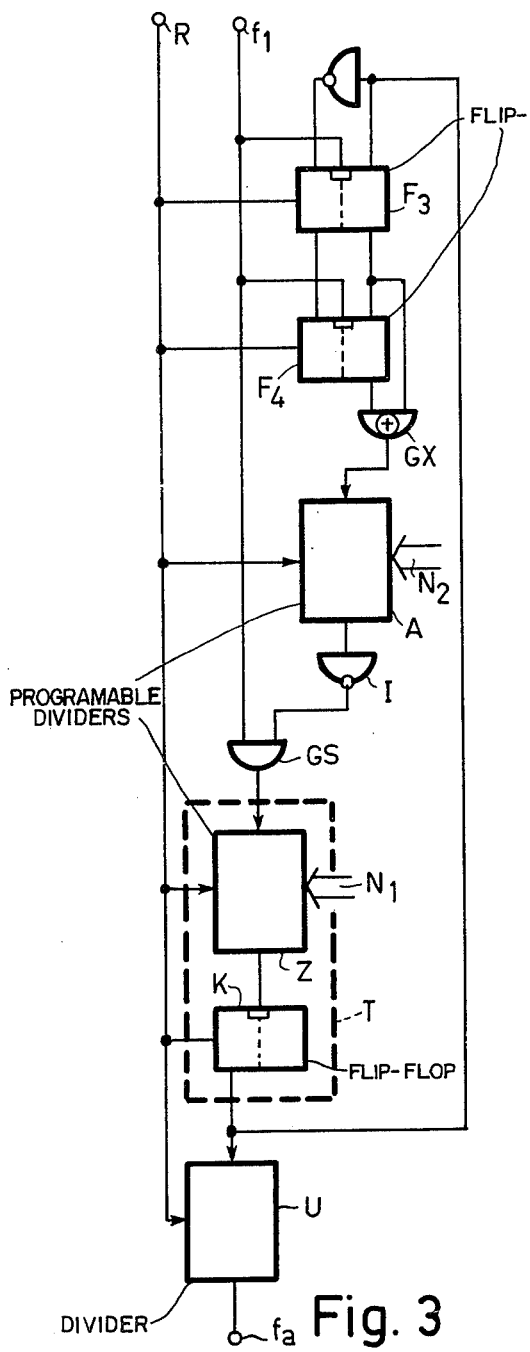
FIG. 3 shows an extended circuit arrangement comprising a subsequent multivibrator and scaler.

FIG. 3 shows an extended circuit arrangement. Components thereof which correspond to those of FIG. 1 are denoted by the same references. The frequency divider T is again preceded by a gate GS, one input of which receives the input frequency $f_1$ while its other input is connected to the selection circuit A via an inverter I. The frequency divider T again comprises a scaling counter scaler Z, which is followed by a bistable multivibrator K which changes over to its other position in reaction to each output pulse of the scaling counter Z. This produces a substantially symmetrical square wave signal on the output of the frequency divider T which, however, necessitates a different synchronization circuit for the counting rhythm of the selection circuit A because now the selection circuit must be triggered upon each edge of the output signal. Therefore, the output signal is supplied direct to one control output of a JK flipflop $F_3$ and, via an inverter $I_1$, to the other control input thereof. The outputs of this flipflop are connected to the control inputs of a further JK flipflop $F_4$, the clock inputs of the two flipflops receiving the input frequency $f_1$. Therefore, when the output signal of the frequency divider T changes its state, the next pulse of the input frequency also changes the state of the flipflop $F_3$, and on the counting input of the selection circuit A a pulse is generated by the exclusive-Or gate GX. The next pulse on the line $f_1$ also changes the state of the flipflop $F_4$, and the input signal of the selection circuit A disappears again. However, because of the succeeding multivibrator K, the output frequency of the scaling counter Z is halved; this has to be taken into account either in the choice of the divisor or by increasing the input frequency.

The equipartition of the output pulses can be further enhanced by connecting a scaler U behind the output of the frequency divider. Even if the frequency divider T has optimum equipartition of its output signals, the deviations from the ideal situation of the output pulses amount to maximum one period of the input frequency $f_1$. This error is reduced by the factor whereby the scaler U reduces the output frequency of the frequency divider T. This scaler can be realized, for example, by means of a cascade of flipflops which are connected as frequency dividers. It is to be noted that a scaler can also be connected without use being made of the multivibrator K, for example, directly to the output denoted by $f_a$ in the circuit of FIG. 1.

FIG. 3 again comprises a reset line R by means of which all storage stages can be reset to a predetermined starting position.

Figure 4:
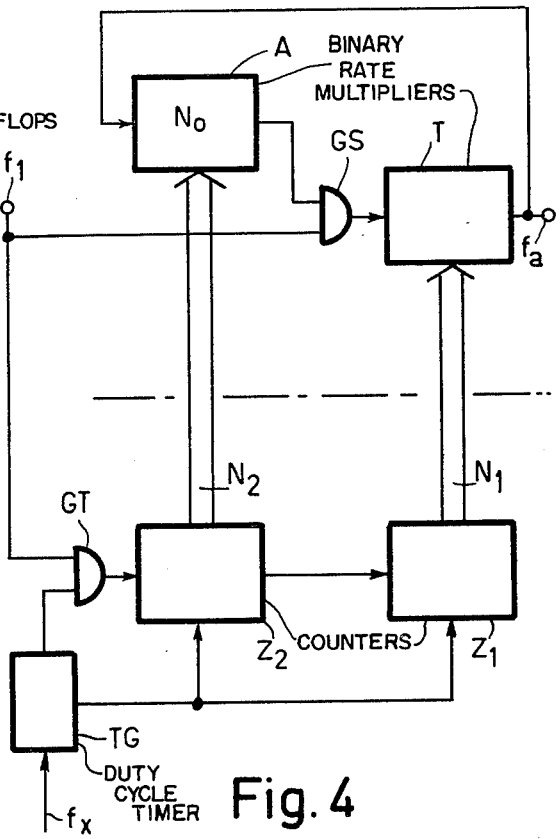
FIG. 4 shows a circuit arrangement for generating the adjusting signals for the frequency divider and the selection circuit.

In many cases, for example, representation of analog quantities by a frequency, an output frequency must be generated which equals a given frequency. In such a case it is not necessary that the absolute value of the input frequency is exactly known, but this frequency must merely be very constant. The divisor is not known either, and the given frequency should be duplicated as accurately as possible. This can be achieved using the circuit arrangement of FIG. 4. The upper half of this FIG., i.e. above the stroke-dot line, again shows the frequency divider T which receives the input frequency $f_1$ via a gate GS, its other input being connected to the output of the selection circuit A. For the sake of simplicity of the drawing, the synchronization circuit for the counting signals of the selection circuit has been omitted, its input being shown to be connected directly to the output frequency. The divisor of the frequency divider T can be adjusted to the number $N_1$ by electrical signals as already described for the circuit arrangements of FIGS. 1 and 3. Similarly, the selection circuit A can be adjusted by electrical signals such that it generates output signals at $N_2$ positions within the permanent given cycle of $N_O$ positions. If a commercially available "Binary rate multiplier" is used for the selection circuit, this number $N_2$ can be directly supplied in binary coded form, and the selection circuit then also automatically supplies a corresponding output pulse sequence have a substantially optimum equipartition. The divisor $N_1$ for the frequency divider T can also be supplied directly in coded form in many cases, that is to say when the divisor corresponds to the counting position of the frequency divider whereto the latter is set when the O-position or 1-position.

The signals for these two numbers $N_1$ and $N_2$ are automatically generated by two further counters $Z_1$ and $Z_2$, without the ratio between the frequency to be replicated and the input frequency being known. To this end, the frequency $f_x$ to be replicated is supplied to a gate control generator TG which first generates a reset signal which resets the counters $Z_1$ and $Z_2$ to their O-position. Subsequently, in reaction to a further output signal a signal is generated which opens the gate GT for a time of, for example, 1000 periods of the frequency $f_x$ to be replicated, and supplies the input frequency $f_1$ to the counting input of the counter $Z_2$ during this time. The carry output of the counter is connected to the counting input of the next counter $Z_1$. If the counter $Z_2$ has a counting capacity which equals the number of pulses of the frequency $f_x$ to be duplicated during which the gate control generator supplies an output signal, the counter $Z_1$ contains the integral part of the divisor at the end of this output signal, while the counter $Z_2$ contains the fraction behind the decimal point. The gate control generator TG is then deactivated and the two counters $Z_1$ and $Z_2$ are used as stores. Because the output signals of these two counters are applied to the frequency divider and the selection circuit A, respectively, the output frequency $f_a$ is then equal to the frequency $f_x$ to be replicated, even if this frequency is no longer present. The portion of the circuit shown above the stroke-dot line of FIG. 4 thus represents the frequency division arrangement, while the portion below the stroke-dot line represents the control circuit for generating the divisor.

Figure 5:
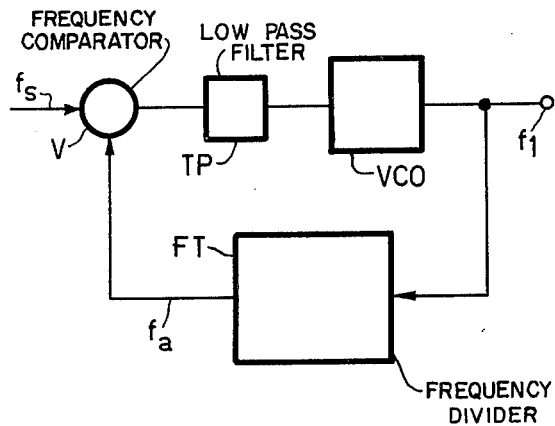
FIG. 5 shows a circuit arrangement for multiplication of a control frequency.

FIG. 5 shows a circuit arrangement by means of which a given control frequency $f_s$ can be multiplied. Therein, the input frequency $f_1$, generated by a voltage-controlled oscillator VCO, is applied to the adjusted frequency division arrangement FT which may correspond, for example, to the circuit arrangement of FIG. 1 or FIG. 3. The generated output frequency $f_a$ is compared with the control frequency $f_s$ in the comparison device V, and a signal corresponding to the deviation is generated. Because this signal fluctuates about a mean value due to the non-ideal equipartition of the output frequency $f_a$, it is applied to the voltage-controlled oscillator VCO via a low-pass filter $T_p$. The deviation signal from the comparison device V then controls this oscillator such that its output frequency $f_1$, after division by the divisor adjusted in the frequency divider FT, equals the control frequency $f_s$, i.e. the control frequency has thus been multiplied by the divisor adjusted in the frequency divider.

What is claimed is:

1. A circuit arrangement for generating an output frequency by division of pulses of an input frequency, comprising a first adjustable frequency divider providing the output of said circuit arrangement, a further adjustable frequency divider, a first gate having an output connected to the input of said first adjustable frequency divider and having a first input connected to the output of said further adjustable frequency divider, means applying the input frequency to a second input of said first gate, said further adjustable frequency divider suppressing selectable pulses of said input frequency applied to said first gate, the division ratio of at least one of said first and said further frequency dividers being adjustable in response to selection signals, two cascade connected counters providing said selection signals, a second gate having an output connected to an input of said cascade counters and having a first input connected to receive said input frequency, and timing means for providing an enabling signal to a second input of said second gate for a time interval equal to a predetermined number of periods of said input frequency, said cascaded counter counting the pulses of said input frequency during said predetermined time interval and adjusting the division ratio of said one of said adjustable frequency dividers in accordance with the number of pulses of said input frequency counted by said counter.

2. A circuit arrangement as claimed in claim 1, wherein the output frequency ($f_a$) is applied to a frequency comparison device (V) which compares this output frequency with a control frequency ($f_s$) and generates a direct voltage signal corresponding to the frequency error or phase error which controls, via a low-pass filter, a voltage-controlled oscillator (VCO) for generating the input frequency ($f_1$) such that the frequency error or phase error is minimized.

* * * * *

UNITED STATES PATENT AND TRADEMARK OFFICE
CERTIFICATE OF CORRECTION

PATENT NO. : 3,976,946
DATED : August 24, 1976
INVENTOR(S) : GERT SCHRODER

It is certified that error appears in the above–identified patent and that said Letters Patent are hereby corrected as shown below:

ON THE TITLE PAGE

Section [75] should read as follows:

--[75] Inventor: Gert Schroder, Hamburg, Germany--;

Col. 2, line 36, "$N_1$ 32 3" should read --$N_1 = 3$--;

Signed and Sealed this

Seventh Day of December 1976

[SEAL]

Attest:

RUTH C. MASON
Attesting Officer

C. MARSHALL DANN
Commissioner of Patents and Trademarks

UNITED STATES PATENT AND TRADEMARK OFFICE
CERTIFICATE OF CORRECTION

PATENT NO. : 3,976,946
DATED : August 24, 1976
INVENTOR(S) : GERD SCHRODER

It is certified that error appears in the above–identified patent and that said Letters Patent are hereby corrected as shown below:

ON THE TITLE PAGE

Section [75] should read as follows:

--[75] Inventor: Gerd Schröder, Hamburg, Germany--.

Column 2, line 36, "$N_1$ 32 3" should read -- $N_1 = 3$ --.

This certificate supersedes Certificate of Correction issued Dec. 7, 1976.

Signed and Sealed this

Twenty-second Day of February 1977

[SEAL]

Attest:

RUTH C. MASON
Attesting Officer

C. MARSHALL DANN
Commissioner of Patents and Trademarks